Figure 1:
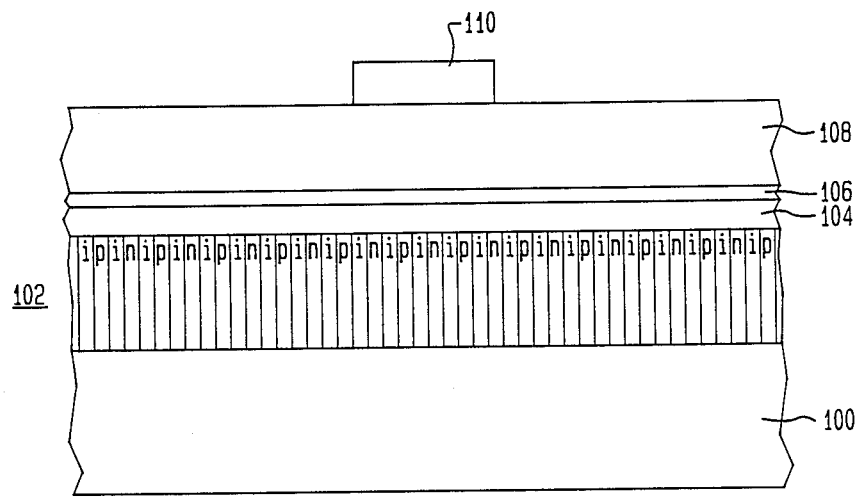

United States Patent [19]

Kohn et al.

[11] Patent Number: 4,855,797
[45] Date of Patent: Aug. 8, 1989

[54] MODULATION DOPED HIGH ELECTRON MOBILITY TRANSISTOR WITH N-I-P-I STRUCTURE

[75] Inventors: Erhard Kohn, Titusville; Karl R. Hofmann, Kingston, both of N.J.

[73] Assignee: Siemens Corporate Research and Support, Inc., Iselin, N.J.

[21] Appl. No.: 69,685

[22] Filed: Jul. 6, 1987

[51] Int. Cl.[4] ............................................. H01L 29/80
[52] U.S. Cl. ..................................... 357/22; 357/58; 357/16; 357/4
[58] Field of Search ................. 357/58, 22 A, 22 MD, 357/16, 4

[56] References Cited

U.S. PATENT DOCUMENTS

| 3,626,328 | 12/1971 | Esaki | 357/16 X |
|---|---|---|---|
| 4,205,329 | 5/1980 | Dingle et al. | 357/16 |
| 4,250,515 | 2/1981 | Esaki et al. | 357/16 |
| 4,257,055 | 3/1981 | Hess et al. | 357/16 |
| 4,261,771 | 4/1981 | Dingle et al. | 148/175 |
| 4,410,902 | 10/1983 | Malik | 357/13 |
| 4,439,782 | 3/1984 | Holonyak Jr. | 357/17 |
| 4,538,165 | 8/1985 | Chang et al. | 357/22 A |
| 4,590,507 | 5/1986 | Capasso et al. | 357/28 |
| 4,688,061 | 8/1987 | Sakaki | 357/22 A |

FOREIGN PATENT DOCUMENTS

| 029481 | 6/1981 | European Pat. Off. |  |
|---|---|---|---|
| 051271 | 5/1982 | European Pat. Off. |  |
| 0056904 | 8/1982 | European Pat. Off. |  |
| 0091831 | 10/1983 | European Pat. Off. |  |
| 119089 | 9/1984 | European Pat. Off. |  |
| 122047 | 10/1984 | European Pat. Off. |  |
| 133342 | 2/1985 | European Pat. Off. |  |
| 136108 | 4/1985 | European Pat. Off. |  |
| 149390 | 7/1985 | European Pat. Off. |  |
| 155215 | 9/1985 | European Pat. Off. |  |
| 0155215 | 9/1985 | European Pat. Off. | 357/22 X |
| 163203 | 12/1985 | European Pat. Off. |  |
| 2261527 | 7/1974 | Fed. Rep. of Germany | 357/4 X |
| 59-168651 | 9/1982 | Japan . |  |
| 58-139464 | 8/1983 | Japan . |  |
| 58-141552 | 8/1983 | Japan . |  |
| 58-141561 | 8/1983 | Japan . |  |
| 58-141573 | 8/1983 | Japan . |  |
| 58-147158 | 9/1983 | Japan . |  |
| 58-147173 | 9/1983 | Japan . |  |
| 0136108 | 4/1985 | Japan | 357/22 X |
| 6194376 | 5/1986 | Japan | 357/4 X |
| 2171250 | 8/1986 | United Kingdom . |  |

OTHER PUBLICATIONS

Ploog et al., "Dotierungsstrukturen in Galliumarsenid-Schichten," *Elektonik Industrie* 4, 1978, pp. 13-15.

Japanese Journal of Applied Physics, vol. 23, No. 2, Feb. 1984; pp. L61-L63.

Microelectronics Journal, vol. 13, No. 3, 1982; pp. 5-22.

Applied Physics Letters, vol. 47 (12), 15 Dec. 1985; pp. 1324-1326.

Solid State Comm. (USA), vol. 54, No. 5, pp. 383-387; May 1985.

Solid State Comm. (USA), vol. 45, No. 1, pp. 23-25; Jan. 1983.

"Periodic doping structure in GaAs", Molecular Beam Epitaxy, Pergamon, Oxford, England, pp. 145-168; 1980.

H. Sakaki, "Velocity-Modulation Transistor (VMT)-A New Field-Effect Transistor Concept"; Japanese Journal of Applied Physics; vol. 21, No. 6., June. 1982., pp. L381-L383.

(List continued on next page.)

*Primary Examiner*—Andrew J. James
*Assistant Examiner*—William A. Mintel
*Attorney, Agent, or Firm*—Adel A. Ahmed

[57] ABSTRACT

A modulation-doped field effect transistor includes an undoped semiconductor layer and an arrangement for supplying charge carriers into a region of the semiconductor layer adjacent one side. An arrangement is provided for locally modulating hole and electron density in another region adjacent the other side of the semiconductor layer in a repeating pattern of alternations so as to inhibit current flow in the direction of the alternations.

19 Claims, 1 Drawing Sheet

OTHER PUBLICATIONS

K. Hirakawa, H. Sakaki, and J. Yoshino; "Mobility Modulation of the Two-Dimensional Electron Gas Via Controlled Deformation of the Electron Wave Function in Selectively Doped AlGaAs-GaAs Heterojunctions"; Physical Review Letters, vol. 54, Number 12, Mar. 25, 1985, pp. 1279–1282.

A. Kastalsky and S. Luryl, "Novel Real-Space Hot-Electron Transfer Devices"; IEEE Electron Device Letters, vol. EDL-4, No. 9, Sep. 1983, pp. 334–336.

C. O. Bozler, M. A. Hollis, K. B. Nichols, S. Rabe, A. Vera, and C. L. Chen, "18.5-dB Gain at 18 GHz with a GaAs Permeable Base Transistor"; IEEE Electron Device Letters, vol. EDL-6, No. 9, Sep. 1985, pp. 456–458.

U. Mishra, P. A. Maki, J. R. Wendt, W. Schaff, E. Kohn, L. F. Eastman; "Vertical Electron Transistor (VET) in GaAs With a Heterojunction AlGaAs-GaAs Cathode"; Electronics Letters; 2nd Feb. 1984, vol. 20, 3, pp. 145–146.

"Vertical Electron Transistor (VET) in GaAs with a Heterojunction (AlGaAs-GaAs) Cathode", U. Mishra et al., Electronics Letters 2nd Feb. 1984, vol. 20, No. 3.

"GaAs Enhancement/Depletion n-channel MOSFET", E. Kohn et al., Solid State Electronics, vol. 21, pp. 877–886; 1978.

Electronics Letters, 24th Nov. 1983, vol. 19, No. 24, pp. 1021–1023.

Elektronik Industrie, vol. 4, 1978; pp. 13–15.

"Doping Superlattices in Organometallic Vapor Phase Epitaxial InP", App. Phys. Lett. (USA), vol. 47, No. 4, pp. 405–407, 15 Aug. 1985, 14 REF., Yuan, J. S., et al.

"Theoretical Analyses of Space-Charge Doping in Amorphous Semiconductor Superlattices, I. Doping Supplattices", Phys. Rev. B (USA), vol. 32, No. 2, pp. 879–884, 15 July 1985, 14 REF., Chen, I.

"High-Speed n-i-p-i Photodetector with Internal Gain", Superlattices & Microstruct (GB), vol. 1, No. 5, pp. 427–431, 1985, 13 REF, Dohler, G. H.

"Electron States in Doping Superlattice-Si-nipi Structure", Chin J. Semicond. (China), vol. 6, No. 4, pp. 446–450, Jul. 1985, 9 REF., Wang, Enge, et al.

"What can Molecular Beam Epitaxy do for Silicon Devices?", Thin Solid Films (Switzerland), vol. 123, No. 4, pp. 273–279, 25 Jan. 1985, 5 REF., Allen, F. G.

"The Potential on n-i-p-i Doping Superlattices for Novel Semiconductor Devices" Superlattices & Microstruct. (GB), vol. 1, No. 3, pp. 279–287, 1985, 29 REF., Dohler, G. H.

"Amorphous Silicon Bulk Barrier Phototransistor with Schottky Barrier Emitter", Appl. Phys. Lett. (USA), vol. 47, No. 1, Jul. 1985, 8 REF., Chang, C. Y., et al.

"Photoelectric Control of the Dependence of the Electrical Parameters of Semiconductor Structures on their Mode of Operation", Izv. VUG Radioelektron, (USSR), vol. 26, No. 12, pp. 72–73, 1983, 2 REF., Moshin, V. I., et al.

"Luminescence from Hot Electrons relaxing by LO Phonon Emission in p-GaAs and GaAs Doping Superlattices", Solid State Commun. (USA), vol. 54, No. 5, pp. 383–387, May 1985, 15 REF., Fasol, G., et al.

"n-i-p-i Doping Superlattices–Semiconductors with Tunable Electronic Properties", Plenum, New York, USA, x+360 PP., pp. 19–32, 1984, 18 REF., Dohler, G. H., et al.

"An Advanced Bipolar-MOS-I/sup 2/L Technology with a Thin Epitaxial Layer for Analog-Digital VLSI", IEEE Trans. Electron Devices (USA), vol. ED-32, No. 2, pp. 232–236, Feb. 1985, 11 REF., Okada, Y., et al.

"MBE Grown n/sup +/−i-Delta (p/sup +/)−i−n/sup +/ GaAs V-Groove Barrier Transistor", IEEE Electron Device Lett. (USA), vol. EDL-6, No. 3, pp. 123–125, Mar. 1985, 11 REF., Chang, C. Y., et al.

"Luminescence and Inelastic Light Scattering in GaAs Doping Superlattices", Springer-Verlag, Berlin, Germany, ix+293 pp., pp. 232–239, 1984, 18 REF., Abstreiter, G., et al.

"Doping Superlattices", Martinus Nijhoff, Dordrecht, Netherlands, v+719 pp., pp. 533–574, 1985, 33 REF., Ploog, K., et al.

"Theory of Absorption in Doping Superlattices", Phys. Rev. B (USA), vol. 30, No. 10, pp. 5932–5944, 15 Nov. 1984, 23 REF., Dohler, G. H., et al.

"Carrier Recombination Time in Amorphous-silicon Doping Superlattices", Phys. Rev. Lett. (USA), vol. 53, No. 16, pp. 1598–1601, 15 Oct. 1984, 10 REF., Hundhausen, M., et al.

"Properties of n-i-p-i doping superlattices in III-V and (List continued on next page.)

OTHER PUBLICATIONS

IV-VI semiconductors", Surf. Sci, (Netherlands), vol. 142, No. 1-3, pp. 474-485, Jul. 1984, 36 REF., Dohler, G. H. et al.

"n-i-p-i-crystals' semiconductors with controllable electronic properties", Phys. Bl. (Germany), vol. 40, No. 7, pp. 182-187, Jul. 1984, 9 REF., Dohler G. H.

"Raman-scattering from elementary excitations in GaAs with 'n-i-p-i' doping superlattices", J. Phys. C (GB), vol. 17, No. 8, pp. 1395-1403, 20 Mar. 1984, 15 REF., Fasol, G., et al.

"n-i-p-i doping superlattices-tailored semiconductors with tunable electronic properties", Friedr. Vieweg & Sohn, Braunschweig, Germany, viii+326 pp., pp. 207-226, 1983, 45 REF., Dohler, G. H., et al.

"Planar doped barriers and their device applications", Japan Soc. Appl. Phys., Tokyo Japan, 312 pp., pp. 29-32, 1982, O REF., Malik, R.

"Semiconductors with n-i-p-i doping superlattices--electrooptical device aspects", Japan Soc. Appl. Phys., Tokyo Japan, 312 pp., pp. 21-24, 1982, 3 REF., Dohler, G. H.

"GaAs doping superlattices a new class of semiconductor materials grown by molecular beam epitaxy", Japan Soc. Appl. Phys., Tokyo, Japan, 312 pp., pp. 17-20, 1982, 3 REF., Ploog, K.

"Semiconductors with hetero-n-i-p-i superlattices", Surf. Sci. (Netherlands), vol. 132, No. 1-3, pp. 540-542, Sep. 1983, 12 REF., Ruden, P., et al.

"New amorphous silicon majority-carrier device", Appl. Phys. Lett. (USA), vol. 43, No. 1, pp. 90-92, 1 Jul. 1983, 10 REF., Jiang, Jin, et al.

J. Vac. Sci. & Technol. B. (USA), vol. 1, No. 2, pp. 278-284, Apr.-Jun. 1983, 35 REF., Dohler, G. H.

"Elementary excitations in semiconductors with n-i--p-i doping superlattices", J. Vac. Sci. & Technol. B. (USA), vol. 1, No. 2, pp. 285-288, Apr.-Jun. 1983, 26 REF., Ruden, P.

n-i-p-i superlattices-novel semiconductors with tunable properties", Jpn. J. Appl. Phys. Suppl. (Japan), pp. 29-35, 1982, 18 REF., Dohler, G. H.

"A study of substrate effects on planar doped structures in gallium arsenide grown by molecular beam epitaxy", IOP, Bristol, England, xvi+650 pp., pp. 149-156, 1983, 18 REF., Palmateer, S. C., et al.

"Multi-gap amorphous Si solar cells prepared by the consecutive, separated reaction chamber method", IEEE, New York, USA, 1484 pp., pp. 1338-1343, 1982, 11 REF., Kuwano, Y., et al.

"Time resolved luminescence in n-i-p-i doping superlattices", Physica B & C (Netherlands), vol. 117-118 B+C, pt. 2, pp. 732-734, Mar. 1983, 8 REF., Rehm, W., et al.

"Growth of planar doped barrier structures in gallium arsenide by molecular beam epitaxy", J. Phys. Colloq. (France), vol. 43, No. C-5, pp. 321-322, Dec. 1982, 2 REF., Palmateer, S. C. et al.

"Anisotropy effects and optical excitation of acoustic phonons in n-i-p-i doping superlattices", Solid State Commun. (USA), vol. 45, No. 1, pp. 23-25, Jan. 1983, 9 REF., Ruden, P., et al.

Planar doped barriers by molecular beam epitaxy for millimeter wave devices", Proc. SPIE Int. Soc. Opt. Eng. (USA), vol. 317, pp. 243-250, 1981, 14 REF., Malik, R. J.

"Hydrogenated amorphous silicon solar cells," Thin Solid Films (Switzerland), vol. 90, No. 4, pp. 441-449, 30 Apr. 1982, 31 REF., Abeles, B., et al.

"n-i-p-i superlattices: theoretical predictions and experimental verification", J. Vac. Sci. & Technol. (USA), vol. 21, No. 2, pp. 514-515, Jul.-Aug. 1982, 12 REF., Dohler, G. H.

"The design and growth of GaAs planar doped barriers by MBE", Mater. Lett. (Netherlands), vol. 1, No. 1, pp. 22-25, Jun. 1982, 14 REF., Malik, R. J.

"Photoluminescence study of electron-hole recombination across the tunable effective gap in GaAs n-i-p-i superlattices", Solid State Commun. (USA), vol. 43, No. 4, pp. 291-294, Jul. 1982, 7 REF., Jung. H. et al.

"Growth and properties of new artificial doping superlattices in GaAs", Microelectron. J. (GB), vol. 13, No. 3, pp. 5-22, May-Jun. 1982, 59 REF., Ploog, K., et al.

"Electric properties of unipolar GaAs structures with ultrathin triangular barriers", Appl. Phys. Lett. (USA), vol. 40, No. 9, pp. 832-833, May 1, 1982, 11 REF, Gossard, A. C., et al.

"Tunable absorption coefficient in GaAs doping superlattices", Phys. Rev. B (USA), vol. 25, No. 4, pp. 2616-2626, Feb. 15, 1982, 9 REF., Dohler, G. H., et al.

"Quantization of photoexcited electrons in GaAs nipi crystals", Surf. Sci. (Netherlands), vol. 113, No. 1-3, pp. 479-480, Jan. 1982, 2 REF., Abstreiter, G., et al.

"Recent European developments in MBE", J. Vac. Sci. & Technol. (USA), vol. 19, No. 2, pp. 150-156, Jul.-Aug. 1981, 26 REF., Farrow R. F. C.

"Novel periodic doping structures in GaAs grown by molecular beam epitaxy", IOP, Bristol, England, (List continued on next page.)

OTHER PUBLICATIONS xv+753 pp., pp. 721-730, 1981, 17 REF., Ploog, K., et al.

"Rectifying, variable planar-doped-barrier structures in GaAs", IOP, Bristol, England, xv+753 pp., pp. 697-710, 1981, 15 REF., Malik, R. J., et al.

"Semiconductor superlattices-a new material for research and applications", Phys. Scr. (Sweden), vol. 24, No. 2, pp. 430-439, Aug. 1981, 44 REF, Dohler, G. H.

The use of Si and Be impurities for novel periodic doping structures in GaAs grown by molecular beam epitaxy", J. Electrochem. Soc. (USA), vol. 128, No. 2, pp. 400-410, Feb. 1981, 38 REF., Ploog, K.

Periodic doping structure in GaAs", Molecular beam epitaxy, Pergamon, Oxford, England, pp. 145-168, 1980, 32 REF., Dohler, G. H., et al.

"Design and performance of a medium-power asymmetrical thyristor", GEC J. Sci. & Technol. (GB), vol. 46, No. 2, pp. 67-72, 1980, 7 REF., Cordingley, B. V., et al.

"Periodic doping structure in GaAs", Prog. Cryst. Growth & Charact. (GB), vol. 2, No. 1-2, pp. 145-168, 1979, 32 REF., Dohler, G. H., et al.

"Doping structures in gallium arsenide layers", Elektron. Ind. (Germany), vol. 9, No. 4, pp. 13-15, Apr. 1978, 18 REF., Ploog, K. et al.

U.S. Patent     Aug. 8, 1989     4,855,797

MODULATION DOPED HIGH ELECTRON MOBILITY TRANSISTOR WITH N-I-P-I STRUCTURE

The present invention relates to field effect transistors and more particularly to modulation-doped high electron mobility field effect transistors.

Field effect transistors (FET's) using gallium arsenide (GaAs) are known to be capable of high speed operation. Devices using gallium arsenide/aluminum gallium arsenide (GaAs/AlGaAs) heterostructures form a two-dimensional electron gas (2DEG). In such devices the donor impurities are confined away from the active channel in which electrons may flow. This separation of donor impurities from the electron may flow. This separation of donor impurities from the electron layers causes the device to exhibit extremely high electron mobilities and thereby to be capable of extremely fast operation, for example, in high speed switching.

Nevertheless, since the electrons in the device must still transit the channel length, an ultimate switching speed depending on the channel length will exist, so long as the conductivity modulation of the device is achieved by varying the carrier density in the channel.

In accordance with a first aspect of the invention, a modulationdoped field effect transistor comprises a first semiconductor layer being substantially undoped, an arrangement on one side of the first semiconductor layer for supplying charge carriers into a first region of the first semiconductor layer adjacent the one side of the semiconductor layer, and an arrangement for locally modulating hole and electron density in a second region of the first semiconductor layer adjacent another side thereof in a repeating pattern of alternations so as to substantially inhibit conduction therethrough in the direction of the alternations.

In accordance with a second aspect of the invention, the modulation doped field effect transistor includes a gate arrangement for shifting the charge carriers between the first and second regions.

In accordance with a third aspect of the invention, the arrangement for locally modulating doping comprises alternating p and n doped semiconductor regions adjacent the second region.

In accordance with a fourth aspect of the invention, the arrangement for supplying charge carriers comprises a second semiconductor layer adjacent the first region.

In accordance with a fifth aspect of the invention, the first semiconductor layer is gallium arsenide and the second semiconductor layer is aluminum gallium arsenide.

In accordance with a sixth aspect of the invention, the first and second semiconductor layers are separated by a third semiconductor layer of aluminum gallium arsenide, the third semiconductor layer being thin compared with the first and second semiconductor layers.

In accordance with a seventh aspect of the invention, the alternating p and n doped semiconductor regions are formed in respective layers of aluminum gallium arsenide.

In accordance with an eighth aspect of the invention, a modulation-doped field effect transistor includes a first semiconductor layer being substantially undoped, a second semiconductor layer of a first conducting type, formed over the first semiconductor layer, and a gate electrode arrangement formed over the second semiconductor layer for controlling conduction through a conduction channel formed in the first semiconductor layer. The transistor includes a third semiconductor layer of the first conductivity type and a fourth semiconductor layer of a second conductivity type formed next the third semiconductor layer, the third and fourth semiconductor layers having respective ends on one side thereof abutting the first semiconductor layer.

In accordance with a ninth aspect of the invention, the third and fourth semiconductor layers form part of a plurality of semiconductor layers of Al Ga As in a sandwich structure of alternating p and n conductivity type semiconductor layers, the plurality of layers having respective ends on the one side abutting the first semiconductor layer and having respective ends on the other side abutting the fifth semiconductor layer.

In accordance with a tenth aspect of the invention, a sixth semiconductor layer of substantially undoped AlGaAs is interposed between the first and second semiconductor layers, the sixth semiconductor layer being relatively thin compared with the first and second semiconductor layers.

In accordance with an eleventh aspect of the invention, a semiconductor layer of AlGaAs of substantially intrinsic conductivity is interposed between each one of the plurality of semiconductor layers and the next, such that a repeating pattern of conductivities is formed in the sandwich structure of n-conductivity, intrinsic-conductivity, p-conductivity, and intrinsic-conductivity semiconductor layers.

In accordance with a further aspect of the invention, a modulation-doped field effect transistor comprises a first-semiconductor layer being substantially undoped, and a second semiconductor layer of a first conductivity type, formed over the first layer. The transistor further includes a gate electrode formed over the second semiconductor layer for controlling conduction through a conduction channel formed in the first semiconductor layer, the conduction channel forming a main controllable-conduction path of the transistor, and a plurality of semiconductor layers of the first conductivity type and a second conductivity type, in a layered structure with the first and second conductivity types alternating. The plurality of semiconductor layes has respective ends on one side thereof abutting the first semiconductor layer such that the plurality of semiconductor layers on the one hand and the first and second layers on the other hand are in substantially mutually perpendicular planes with the first and second conductivity types in the plurality of semiconductor layers alternating progressively along a length direction of the conduction channel, the layers in the plurality being of sufficient thickness to prevent substantially conduction through the plurality of semiconductor layers in a direction perpendicular to the planes of the plurality of semiconductor layers.

Figure 2:
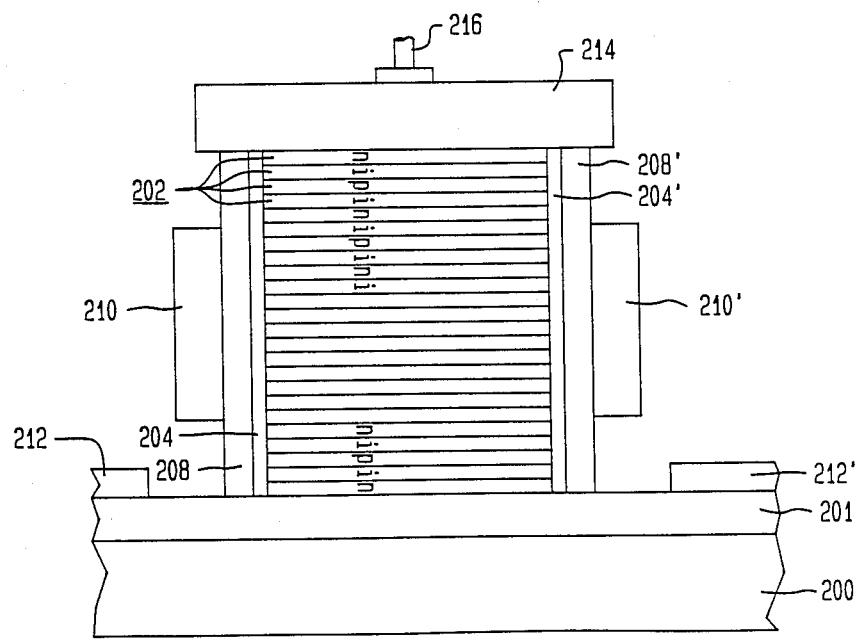

The invention will next be described in greater detail, with reference to the drawing, in which:

FIG. 1 shows a cross-sectional view, not to scale, of a four-terminal modulation doped field effect transistor structure in accordance with the invention; and FIG. 2 shows a cross-sectional view, not to scale, of a vertical field effect transistor structure in accordance with the invention. Features in FIG. 2 corresponding to features in FIG. 1 are designated by the same reference numeral augumented by 100.

In the transistor structure of FIG. 1, 100 is a substrate layer of gallium arsenide (GaAs). Adjoining substrate layer 100 is a region generally designated in FIG. 1 as 102, comprising a composite of aluminum gallium arsenide (AlGaAs) layers lying in planes substantially perpendicular to the plane of substrate 100. The layers are arranged in a sequence of n-doped, intrinsic (i), p-doped (p), intrinsic (i), n-doped, intrinsic materials, and so on, in the same repeating group sequence of n-i-p-i. While more than one such n-i-p-i group is utilized in the exemplary embodiment, the total number of such groups is not, in itself, a primary consideration. The lateral thickness of the n-i-p-i layers is made sufficiently large to substantially prevent superlattice behavior. Adjoining n-i-p-i region 102 in a plane generally parallel to the plane of substrate 100 is a layer 104 of substantially undoped GaAs. Accordingly, substrate 100 and layer 104 include n-i-p-i region 102 therebetween, the planes of the n-i-p-i region being substantially perpendicular to the planes of layer 100 and layer 104. Adjoining layer 104 is a layer 106 of substantially undoped AlGaAs. referred to herein as spacer 106. Spacer 106 is a relatively thin layer. Adjoining spacer 106 is a layer 108 of n-doped AlGaAs which forms a gate dielectric for a gate 110 which is of a conductive material and is adjacent layer 108.

To summarize, the layer arrangement comprises semi-insulating substrate 100, n-i-p-i region 102, undoped GaAs layer 104, undoped AlGaAs spacer 106, n-doped AlGaAs layer 108, and conductive gate 110.

In operation, layer 108 performs the function of an electron donor, contributing electrons which, having passed through spacer 106, form a two dimensional electron gas, commonly referred to in the literature as 2DEG, in at least that portion of undoped GaAs layer 104 which adjoins spacer 106 and which can be thought of as the active channel.

The thickness of spacer 106 provides a compromise since increasing the thickness leads to higher electron mobility but will also cause lower electron densities in the active channel. Spacer 106 may also be dispensed with altogether, as will be described later.

To the extent of separating mobile carriers from the supplying dopant atoms, the present arrangement resembles known selectively doped hetero-junction transistors (SDHT), also referred to as high electron mobility transistors (HEMT) in which such separation is achieved by using the band-gap discontinuity in the conduction band of two epitaxially grown layers of different composition and doping (e.g. AlGaAs and GaAs).

With no bias applied between layer 104 and n-i-p-i region 102, the density of holes and electrons in layer 104 will be formed or modulation doped in a pattern corresponding to the n-i-p-i layers. Accordingly, current cannot flow in a horizontal direction at this interface, i.e. parallel to the interface. Thus, if n-i-p-i region 102 is allowed to float electrically, and a potential difference is applied in a horizontal direction, that is, in a direction along the plane of layer 104 substantially no current will flow in response to such an electric field applied between the ends of layer 104, for example by way of source and drain electrodes, not shown in FIG. 1.

On the other hand, when a positive bias voltage is applied to gate electrode 110, electron current responsive to a horizontally applied potential difference can flow horizontally in the upper portion of layer 104, that is, the portion distal from n-i-p-i region 102. The transition from non-conduction to conduction in layer 104 and vice versa occurs as a result of the 2DEG in layer 104 being switched from near the bottom interface to the top interface and vice versa. Since the thickness dimension of layer 104 is extremely small in comparison with the lateral dimensions, such switching is very fast in comparison with the classical FET action and does not suffer from the effects of transit time delay. No gate current or substrate current will flow, other than capacitive displacement current. The device described therefore functions as a very fast switch, a small vertical shift of the electron current between the upper and lower interfaces being sufficient to effect switching.

Thus, so long as the electrons are confined to the vicinity of the top horizontal interface between layer 104 and spacer 106, the device in accordance with the present invention functions similarly to a conventional HEMT. On the other hand, when the electron wave is towards the lower interface, the heterojunction between layer 104 and n-i-p-i region 102, then the channel current depends on the condition at this lower interface where horizontal mobility is constrained, as has been described. Moreover, transfer of the electron wave from the top interface to the lower interface, achieved by a relatively high negative bias on gate 110 can also occur as a result of a relatively high positive bias on substrate 100, used thus as a back gate, in contrast to top gate 110. Also, such a transfer will result from a high positive potential being applied to one end of layer 104, corresponding to a high positive applied drain voltage. Thus, as the applied drain voltage is first increased from a low value, the horizontal or drain current through layer 104 will at first increase in the aforementioned normal FET manner. Thereafter, as the electron wave is shifted toward the lower interface responsive to a higher drain voltage, the drain current will decrease, corresponding to a negative incremental or differential resistance. Such a characteristic is useful in high frequency oscillators and in logic switching. In the device in accordance with the present invention, the negative resistance is moreover controllable by changing the gate potential.

The transistor structure of FIG. 2 has a vertical configuration and respresents a convenient configuration for fabrication. Adjacent a semi-insulating layer 200 is an n-doped GaAs substrate 201 which is provided with drain contacts 212, 212' and adjoins n-i-p-i region 202. Undoped GaAs layers 204, 204' adjoin n-i-p-i region 202 on respective sides thereof to provide active channel areas. N-doped layers 208, 208' adjoin layers 204, 204', respectively and support respective gate electrodes 210, 210'. A source region 214 surmounts n-i-p-i region 202 in a plane parallel to the plane of the n-i-p-i layers and has an electrode 216 coupled thereto.

The transistor in accordance with the present invention has at least two principal fields of application. One field is as a high speed logic switch element, e.g. as an inverter. Another application is as a microwave oscillator, using differential negative resistance controllable by gate bias.

While the invention has been described in terms of preferred embodiments, various changes which do not depart from the scope of the claims following will suggest themselves to one skilled in the art. For example, the intrinsic layers in n-i-p-i region 102 or 202 are not essential, since appropriate modulation doping can also be produced by an n-p-n-p-n-etc. sequence.

We claim:

1. A modulation-doped field effect transistor including a first semiconductor layer being substantially undoped, a second semiconductor layer of a first conductivity type, formed over said first semiconductor layer, and gate electrode means formed over said second semiconductor layer for controlling conduction through a conduction channel formed in said first semiconductor layer, comprising:

a third semiconductor layer of said first conductivity type; and a fourth semiconductor layer of a second conductivity type formed next to said third semiconductor layer, said third and fourth semiconductor layers having respective ends on one side thereof abutting said first semiconductor layer for locally modulating conductivity in said first semiconductor layer in a pattern corresponding to said respective ends.

2. A modulation-doped field effect transistor according to claim 1 wherein said first semiconductor layer is gallium arsenide (GaAs), and said second, third, and fourth layers are aluminum gallium arsenide (AlGaAs).

3. A modulation-doped field effect transistor according to claim 2 wherein said first conductivity type is n and said second conductivity type is p.

4. A modulation-doped field effect transistor according to claim 3 including a fifth layer of a semi-insulating semiconductor, said third and fourth semiconductor layers having respective ends on the other side thereof abutting said fifth semiconductor layer.

5. A modulation-doped field effect transistor according to claim 4 wherein said third and fourth semiconductor layers form part of a plurality of semiconductor layers of AlGaAs in a sandwich structure of p and n conductivity type semiconductor layers in alternating occurrence, said plurality of layers having respective ends on said one side abutting said first semiconductor layer and having respective ends on said other side abutting said fifth semiconductor layer.

6. A modulation-doped field effect transistor according to claim 5 wherein a sixth semiconductor layer of substantially undoped AlGaAs is interposed between said first and second semiconductor layers, said sixth semiconductor layer being relatively thin compared with said first and second semiconductor layers.

7. A modulation-doped field effect transistor according to claim 5, wherein a semiconductor layer of AlGaAs of substantially intrinsic conductivity is interposed between each one of said plurality of semiconductor layers and the next layer, such that a repeating pattern of conductivities is formed in said sandwich structure of n-conductivity, intrinsic-conductivity, p-conductivity, and intrinsic-conductivity semiconductor layers.

8. A modulation-doped field effect transistor according to claim 6 wherein a semiconductor layer of Al·GaAs of substantially intrinsic conductivity is interposed between each one of said plurality of semiconductor layers and the next, such that a repeating pattern of conductivities is formed in said sandwich structure of n-conductivity, intrinsic-conductivity, p-conductivity, and intrinsic-conductivity semiconductor layers.

9. A modulation-doped field effect transistor comprising:

a first-semiconductor layer being substantially undoped;

a second semiconductor layer of a first conductivity type, formed over said first layer;

gate electrode means formed over said second semiconductor layer for controlling conduction through a conduction channel formed in said first semiconductor layer, said conduction channel forming a main controllable conduction path of said transistor; and a plurality of semiconductor layers of said first conductivity type and a second conductivity type, in a layered structure with said layers of said first and second conductivity types alternating, said plurality of semiconductor layers having respective ends on one side thereof abutting said first semiconductor layer such that said plurality of semiconductor layers on the one hand and said first and second layers on the other hand are in substantially mutually perpendicular planes with said first and second conductivity types in said plurality of semiconductor layers alternating progressively along a length direction of said conduction channel for modulating conductivity in said first semiconductor layer in correspondence with such respective ends, said layers in said plurality being of sufficient thickness to substantially prevent conduction through said plurality of semiconductor layers in a direction perpendicular to the planes of said plurality of semiconductor layers.

10. A modulation-doped field effect transistor according to claim 9 including a third semiconductor layer, being substantially undoped and being interposed between said first and second layers.

11. A modulation-doped field effect transistor according to claim 10 including a fourth semiconductor layer of semi-insulating conductivity, said plurality of semiconductor layers having respective ends thereof, on a side thereof opposite said one side thereof, abutting said fourth semiconductor layer.

12. A modulation-doped field effect transistor according to claim 10 wherein said first semiconductor layer is gallium arsenide, said second, third, and fourth semiconductor layers are aluminum gallium arsenide.

13. A modulation-doped field effect transistor according to claim 10 wherein said third semiconductor layer is thin compared with said first and second semiconductor layers.

14. A modulation-doped field effect transistor comprising:

a first semiconductor layer being substantially undoped;

means on one side of said first semiconductor layer for supplying charge carriers into a first region of said first semiconductor layer adjacent said one side of said semiconductor layer;

means for locally modulating hole and electron concentrations in a second region of said first semiconductor layer adjacent another side thereof in a repeating pattern of alternations so as to substantially inhibit conduction therethrough in the direction of said alternations; and gate means for shifting said charge carriers between said first and second regions.

15. A modulation-doped field effect transistor according to claim 14 wherein said means for locally modulating doping comprises alternating p and n doped semiconductor regions adjacent said second region.

16. A modulation-doped field effect transistor according to claim 14 wherein said means for supplying charge carriers comprises a second semiconductor layer adjacent said first region.

17. A modulation-doped field effect transistor according to claim 14 wherein said first semiconductor layer is gallium arsenide and said second semiconductor layer is aluminum gallium arsenide.

18. A modulation-doped field effect transistor according to claim 17 wherein said first and second semiconductor layers are separated by a third semiconductor layer of aluminum gallium arsenide, said third semiconductor layer being thin compared with said first and second semiconductor layers.

19. A modulation-doped field effect transistor according to claim 15 wherein said alternating p and n doped semiconductor regions are formed in respective layers of aluminum gallium arsenide.

* * * * *